United States Patent
Kourakata et al.

(10) Patent No.: US 9,236,323 B2
(45) Date of Patent: Jan. 12, 2016

(54) INTEGRATED HEAT SPREADER FOR MULTI-CHIP PACKAGES

(71) Applicant: INTEL CORPORATION, Santa Clara, CA (US)

(72) Inventors: Shinobu Kourakata, Tsukuba (JP); Kazuo Ogata, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 230 days.

(21) Appl. No.: 13/776,872

(22) Filed: Feb. 26, 2013

(65) Prior Publication Data

US 2014/0239482 A1    Aug. 28, 2014

(51) Int. Cl.
*H01L 23/34*    (2006.01)
*H01L 23/10*    (2006.01)
*H01L 23/367*   (2006.01)
*H01L 23/498*   (2006.01)

(52) U.S. Cl.
CPC ........ *H01L 23/3677* (2013.01); *H01L 23/3675* (2013.01); *H01L 23/49827* (2013.01); *H01L 2224/16225* (2013.01); *H01L 2224/32245* (2013.01); *H01L 2224/73253* (2013.01); *H01L 2924/15311* (2013.01)

(58) Field of Classification Search
USPC .......................................................... 257/712
See application file for complete search history.

(56) References Cited

U.S. PATENT DOCUMENTS

| | | | |
|---|---|---|---|
| 4,567,505 A * | 1/1986 | Pease | H01L 23/367 165/104.33 |
| 2008/0150127 A1 * | 6/2008 | Raravikar et al. | 257/712 |
| 2009/0166849 A1 * | 7/2009 | Jao et al. | 257/700 |

* cited by examiner

*Primary Examiner* — Marc Armand
*Assistant Examiner* — Wilner Jean Baptiste
(74) *Attorney, Agent, or Firm* — Winkle, PLLC

(57) ABSTRACT

An integrated heat spreader comprising a heat spreader frame that has a plurality of openings formed therethrough and a plurality of thermally conductive structures secured within the heat spreader frame openings. The thermally conductive structures can be formed to have various thicknesses which compensate for varying heights between at least two microelectronic devices in a multi-chip package. The thermally conductive structures can be secured in the heat spreader frame by sizing the openings and the thermally conductive structures such that the thermally conductive structures can be secured within the openings without requiring welding or adhesives.

7 Claims, 6 Drawing Sheets

INTEGRATED HEAT SPREADER FOR MULTI-CHIP PACKAGES

TECHNICAL FIELD

Embodiments of the present description generally relate to the removal of heat from microelectronic devices, and, more particularly, to integrated heat spreaders, wherein the integrated heat spreaders may compensate for varying heights between at least two microelectronic devices in a multi-chip package.

BACKGROUND

Higher performance, lower cost, increased miniaturization of integrated circuit components, and greater packaging density of integrated circuits are ongoing goals of the microelectronic industry. As these goals are achieved, microelectronic devices become smaller. Accordingly, the density of power consumption of the integrated circuit components in the microelectronic devices has increased, which, in turn, increases the average junction temperature of the microelectronic device. If the temperature of the microelectronic device becomes too high, the integrated circuits of the microelectronic device may be damaged or destroyed. This issue becomes even more critical when multiple microelectronic devices are incorporated in close proximity to one another in a multiple microelectronic device package, also known as a multi-chip package. Thus, thermal transfer solutions, such as integrated heat spreaders, must be utilized to remove heat from the microelectronic devices. However, the difficulty and cost of fabricating current designs for integrated heat spreaders has become an issue for the microelectronic industry.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
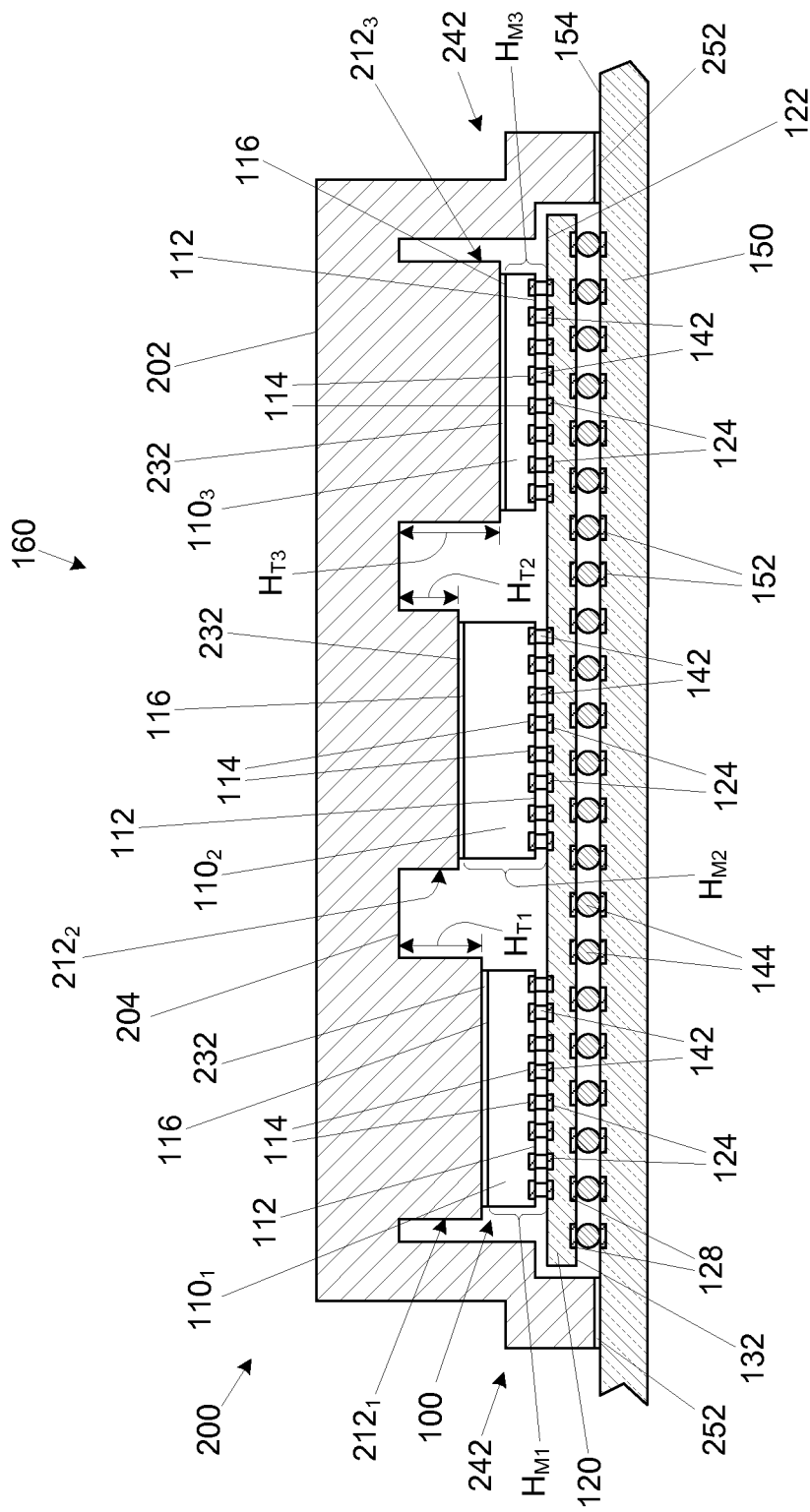
FIG. 1 is a side cross-sectional view of a microelectronic system, as known in the art.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

FIG. 1 illustrates microelectronic system having a multi-chip package coupled with a known integrated heat spreader. In the production of microelectronic systems, multi-chip packages are generally mounted on microelectronic substrates, which provide electrical communication routes between the microelectronic packages and external components. As shown in FIG. 1, a multi-chip package 100 may comprise a plurality of microelectronic devices (illustrated as elements $110_1$, $110_2$, and $110_3$), such as microprocessors, chipsets, graphics devices, wireless devices, memory devices, application specific integrated circuits, or the like, attached to a first surface 122 of a microelectronic interposer 120 through a plurality of interconnects 142, respectively, such as reflowable solder bumps or balls, in a configuration generally known as a flip-chip or controlled collapse chip connection ("C4") configuration. The device-to-interposer interconnects 142 may extend from bond pads 114 on an active surface 112 of each of the microelectronic devices $110_1$, $110_2$, and $110_3$ and bond pads 124 on the microelectronic interposer first surface 122. The microelectronic device bond pads 114 of each of the microelectronic devices $110_1$, $110_2$, and $110_3$, may be in electrical communication with integrated circuitry (not shown) within the microelectronic devices $110_1$, $110_2$, and $110_3$. The microelectronic interposer 120 may include at least one conductive route (not shown) extending therethrough from at least one microelectronic interposer first surface bond pad 124 and at least one microelectronic package bond pad 128 on or proximate a second surface 132 of the microelectronic interposer 120. The microelectronic interposer 120 may reroute a fine pitch (center-to-center distance between the microelectronic device bond pads 114) of the microelectronic device bond pads 114 to a relatively wider pitch of the microelectronic package bond pads 128.

The multi-chip package 100 may be attached to a microelectronic substrate 150, such as printed circuit board, a motherboard, and the like, through a plurality of interconnects 144, such as reflowable solder bumps or balls. The package-to-substrate interconnects 144 may extend between the microelectronic package bond pads 128 and substantially mirror-image bond pads 152 on a first surface 154 of the microelectronic substrate 150. The microelectronic substrate bond pads 152 may be in electrical communication with conductive routes (not shown) within the microelectronic substrate 150, which may provide electrical communication routes to external components (not shown).

Both the microelectronic interposer 120 and the microelectronic substrate 150 may be primarily composed of any appropriate material, including, but not limited to, bismaleimine triazine resin, fire retardant grade 4 material, polyimide materials, glass reinforced epoxy matrix material, and the like, as well as laminates or multiple layers thereof. The microelectronic interposer conductive routes (not shown) and the microelectronic substrate conductive routes (not shown) may be composed of any conductive material, including but not limited to metals, such as copper and aluminum, and alloys thereof. As will be understood to those skilled in the art, microelectronic interposer conductive routes (not shown) and the microelectronic substrate conductive routes (not shown) may be formed as a plurality of conductive traces (not shown) formed on layers of dielectric material (constituting the layers of the microelectronic substrate material), which are connected by conductive vias (not shown).

The package-to-substrate interconnects 144 can be made of any appropriate material, including, but not limited to, solders materials. The solder materials may be any appropriate material, including but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. When the multi-chip package 100 is attached to the microelectronic substrate 150 with package-to-substrate interconnects 144 made of solder, the solder is reflowed, either by heat, pressure, and/or sonic energy to secure the solder between the microelectronic package bond pads 128 and the microelectronic substrate bond pads 152.

As further illustrated in FIG. 1, an integrated heat spreader 200 may be in thermal contact with the multi-chip package 100, to form a microelectronic system 160. The integrated heat spreader 200 may be made of any appropriate thermally conductive material, such a metals and alloys, including, but not limited to, copper, aluminum, and the like.

The integrated heat spreader 200 may have a first surface 202 and an opposing second surface 204, wherein the integrated heat spreader 200 includes a plurality terraces (illustrated as elements $212_1$, $212_2$, and $212_3$) extending from the integrated heat spreader second surface 204. As illustrated, the integrated heat spreader terraces $212_1$, $212_2$, and $212_3$ may have differing heights $H_{T1}$, $H_{T2}$, and $H_{T3}$ extending from the integrated heat spreader second surface 204 to compensate for differing heights $H_{M1}$, $H_{M2}$, and $H_{M3}$ of the microelectronic devices $110_1$, $110_2$, and $110_3$ (i.e. the distance between the microelectronic substrate first surface 154 and a back surface 116 of each microelectronic devices $110_1$, $110_2$, and $110_3$), respectively, in order to make thermal contact therebetween. A thermal interface material 232, such as a thermally conductive grease or polymer, may be disposed between each integrated heat spreader terrace $212_1$, $212_2$, and $212_3$ and its respective back surface 116 of each microelectronic device $110_1$, $110_2$, and $110_3$ to facilitate heat transfer therebetween.

The integrated heat spreader 200 may include at least one footing 242 extending between the integrated heat spreader second surface 204 and the microelectronic substrate 150, wherein the integrated heat spreader footing 242 may be attached to the microelectronic substrate first surface 154 with an adhesive material 252.

As will be understood to those skilled in the art, the fabrication of the integrated heat spreader 200 requires expensive stamping equipment able to achieve high tonnage stamping forces in order to form complex elements, such as illustrate integrated heat spreader terraces $212_1$, $212_2$, and $212_3$. For example, for a copper integrated heat spreader, such as oxygen-free copper (99.99%), a 600 ton stamping machine may be required to form such integrated head spreader terraces.

Embodiments of the present description relate to integrated heat spreaders that compensate for varying heights between at least two microelectronic devices in a multi-chip package without complex and expensive stamping processes. The integrated heat spreader may comprise a heat spreader frame that has a plurality of openings formed therethrough and a plurality of thermally conductive structures secured within the heat spreader frame openings. The thermally conductive structures can be formed to have various thicknesses which compensate for varying heights between at least two microelectronic devices in a multi-chip package. The thermally conductive structures can be secured in the heat spreader frame by sizing both the openings and the thermally conductive structures such that the thermally conductive structures can secured within the openings without requiring welding or adhesives.

Figure 2:
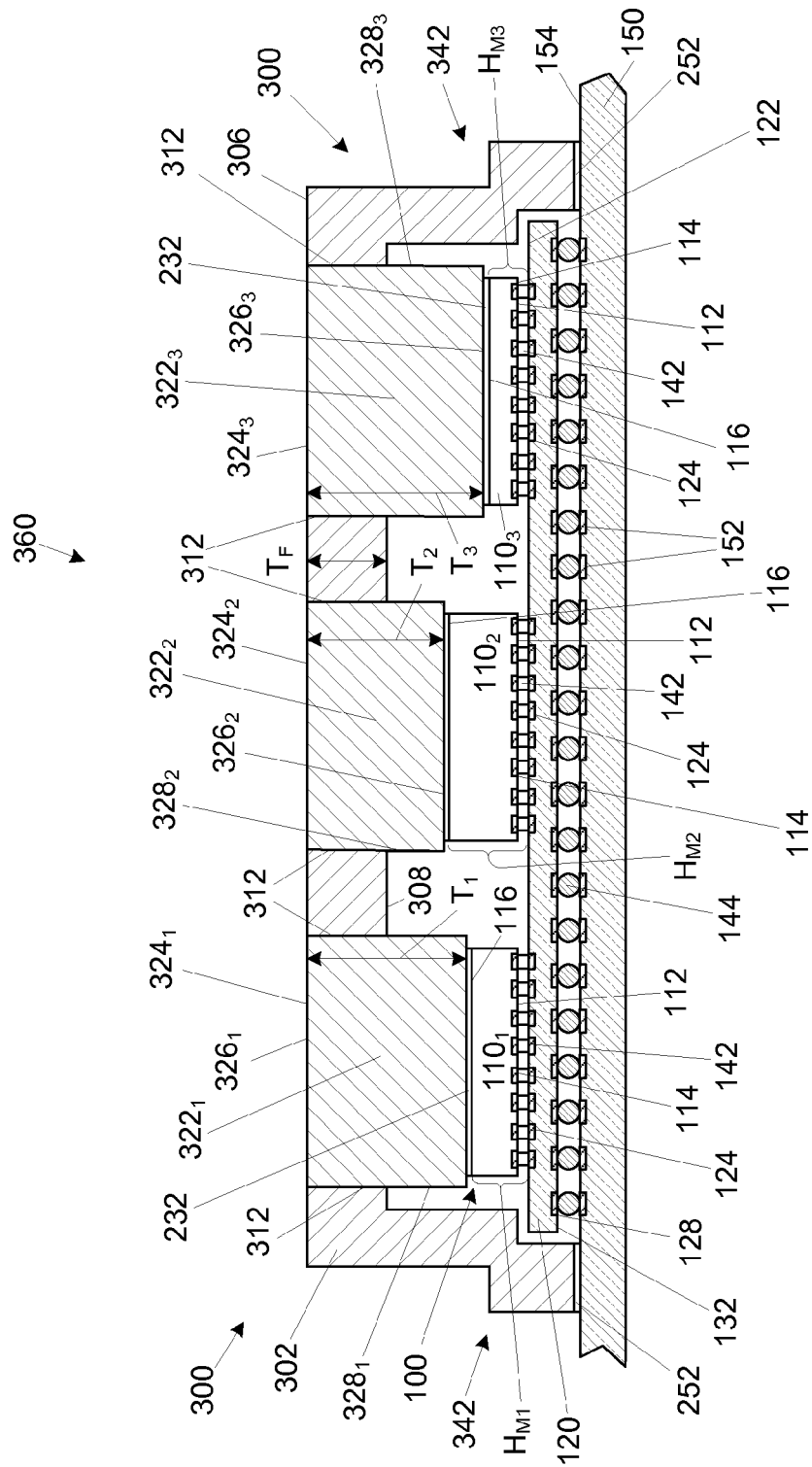
FIG. 2 is a side cross-sectional view of a microelectronic system, according to an embodiment of the present description.

As illustrated in FIG. 2, an integrated heat spreader 300 according to one embodiment of the present description may be in contact with a multi-chip package, such as multi-chip package 100 of FIG. 1. The integrated heat spreader 300 may include a heat spreader frame 302 having a plurality of openings 304 (see FIGS. 3 and 4) extending from a first surface 306 of the heat spreader frame 302 to a second surface 308 of the heat spreader frame 302. The plurality of openings 304 may each define at least one opening sidewall 312 extending between the heat spreader frame first surface 306 and the heat spreader frame second surface 308, and a thickness $T_F$ defined between the heat spreader frame first surface 306 and the heat spreader frame second surface 308. As further illustrated in FIG. 4, thermally conductive structures (illustrated as elements $322_1$, $322_2$, and $322_3$) may be disposed within each of the heat spreader frame openings 304. Each thermally conductive structure $322_1$, $322_2$, and $322_3$ may include a first surface $324_1$, $324_2$, and $324_3$, respectively, an opposing second surface $326_1$, $326_2$, and $326_3$, respectively, and at least one sidewall $328_1$, $328_2$, and $328_3$ extending between the thermally conductive structure first surface $324_1$, $324_2$, and $324_3$ and the thermally conductive structure second surface $326_1$, $326_2$, and $326_3$. Additionally, each thermally conductive structure $322_1$, $322_2$, and $322_3$ may have a thickness $T_1$, $T_2$, and $T_3$, respectively, defined between the thermally conductive structure first surface $324_1$, $324_2$, and $324_3$ and the thermally conductive structure second surface $326_1$, $326_2$, and $326_3$. In one embodiment, each of the plurality of thermally conductive structures $322_1$, $322_2$, and $322_3$ may be secured within a corresponding plurality of heat spreader frame openings 304 with the at least one thermally conductive structure sidewall $328_1$, $328_2$, and $328_3$ abutting its corresponding heat spreader frame sidewall 312. In another embodiment, each thermally conductive structure first surface $324_1$, $324_2$, and $324_3$ of each of the plurality of thermally conductive structures $322_1$, $322_2$, and $322_3$ are substantially planar to the heat spreader frame first surface 306.

As further shown in FIG. 2, the second surface $326_1$, $326_2$, and $326_3$ of each of the plurality of thermally conductive structures $322_1$, $322_2$, and $322_3$, respectively, may be in thermal contact with the back surface 116 of each corresponding microelectronic device $110_1$, $110_2$, and $110_3$, respectively, of the multi-chip package 100. The thermal interface material 232, such as a thermally conductive grease or adhesive, may be disposed between each thermally conductive structure second surface $326_1$, $326_2$, and $326_3$ and its respective microelectronic device $110_1$, $110_2$, and $110_3$ to facilitate heat transfer therebetween. The thermally conductive structures $322_1$, $322_2$, and $322_3$ may be formed to have various thicknesses $T_1$, $T_2$, and $T_3$ to compensate for differing heights $H_{M1}$, $H_{M2}$, and $H_{M3}$ of the microelectronic devices $110_1$, $110_2$, and $110_3$ in a multi-chip package 100. Thus, the thickness $T_1$, $T_2$, and $T_3$ of at least one of the plurality of thermally conductive structures $322_1$, $322_2$, and $322_3$ may be greater than the thickness $T_1$, $T_2$, and $T_3$ of another one of the plurality of thermally conductive structures $322_1$, $322_2$, and $322_3$. Furthermore, the thickness $T_1$, $T_2$, and $T_3$ of at least one of the plurality of thermally conductive structures $322_1$, $322_2$, and $322_3$ may be greater than the thickness $T_F$ of the heat spreader frame 302.

The integrated heat spreader 300 may include a footing 342 extending between the heat spreader frame second surface 308 and the microelectronic substrate 150, wherein the integrated heat spreader footing 342 may be attached to the microelectronic substrate 150 with the adhesive material 252.

Figure 3:
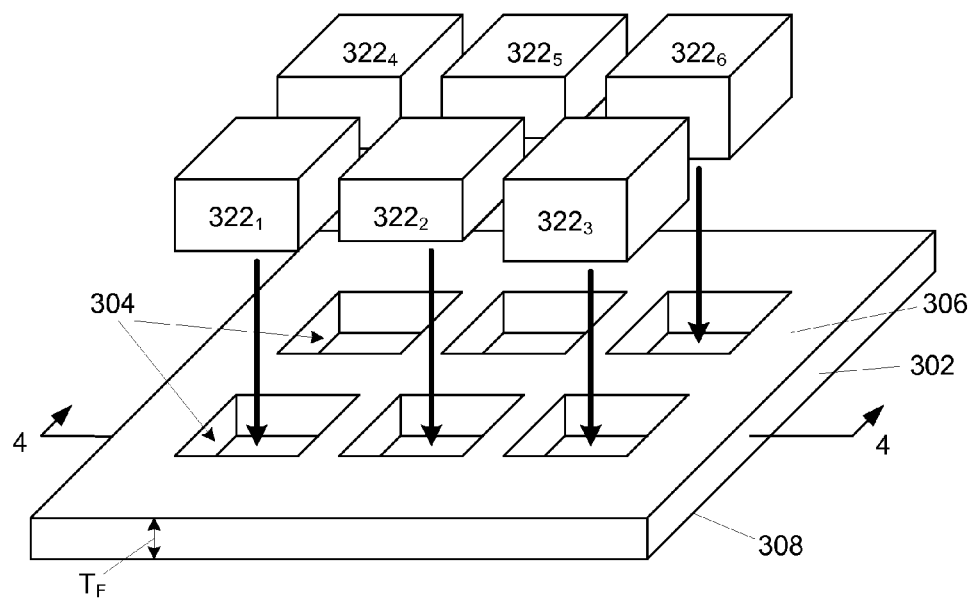
FIG. 3 is an oblique view of thermally conductive structures being inserted into a heat spreader frame, according to an embodiment of the present description.
Figure 4:
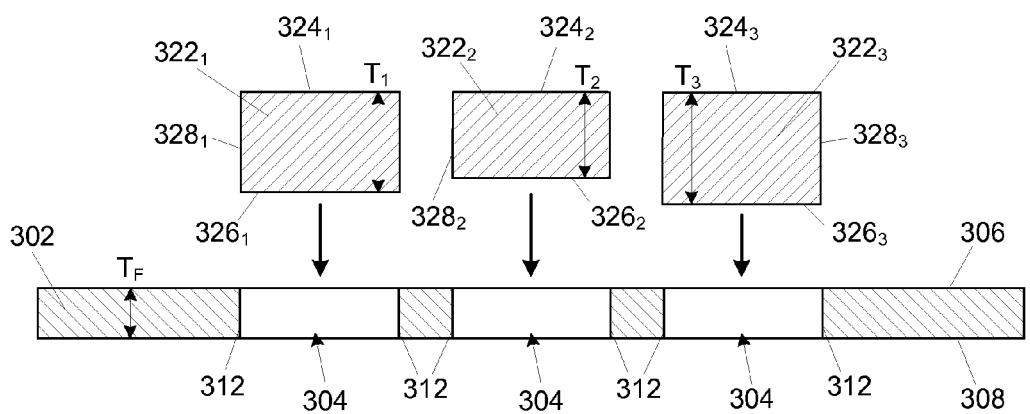
FIG. 4 is a side cross-sectional view of FIG. 3 along line 4-4, according to an embodiment of the present description.

FIGS. 3-7 illustrate a method of fabricating a microelectronic structure according to an embodiment of the present description. As illustrated in FIGS. 3 and 4, the heat spreader frame 302 may be formed having the plurality of openings 304 extending from the heat spreader frame first surface 306 and the opposing heat spreader frame opposing second surface 308. As previously discussed with regard to FIG. 2, the plurality of heat spreader frame openings 304 may each define at least one opening sidewall 312 extending between the heat spreader frame first surface 306 and the heat spreader frame second surface 308, and the thickness $T_F$ defined between the heat spreader frame first surface 306 and the heat spreader frame second surface 308. The heat spreader frame openings 304 may be made by any appropriate means, including but not limited, drilling, stamping, molding, and the like.

As further shown in FIGS. 3 and 4, a plurality of thermally conductive structures (illustrated as elements $322_1$, $322_2$, and $322_3$ with additional elements $322_4$, $322_5$, and $322_6$ illustrated in FIG. 3, hereinafter may be referred to singularly or collectively as "$322_n$") may be formed. As previously discussed with regard to FIG. 2, each thermally conductive structure $322_n$ may include the first surface (illustrated as elements $324_1$, $324_2$, and $324_3$ in FIG. 4) respectively, the opposing second surface (illustrated as elements $326_1$, $326_2$, and $326_3$ in FIG. 4), and at least one sidewall (illustrated as elements $328_1$, $328_2$, and $328_3$ in FIG. 4). Additionally, each thermally conductive structure $322_1$, $322_2$, and $322_3$ may have a thickness $T_1$, $T_2$, and $T_3$, (see FIG. 4) respectively, defined between the thermally conductive structure first surface $324_1$, $324_2$, and $324_3$ and the thermally conductive structure second surface $326_1$, $326_2$, and $326_3$.

Figure 5:
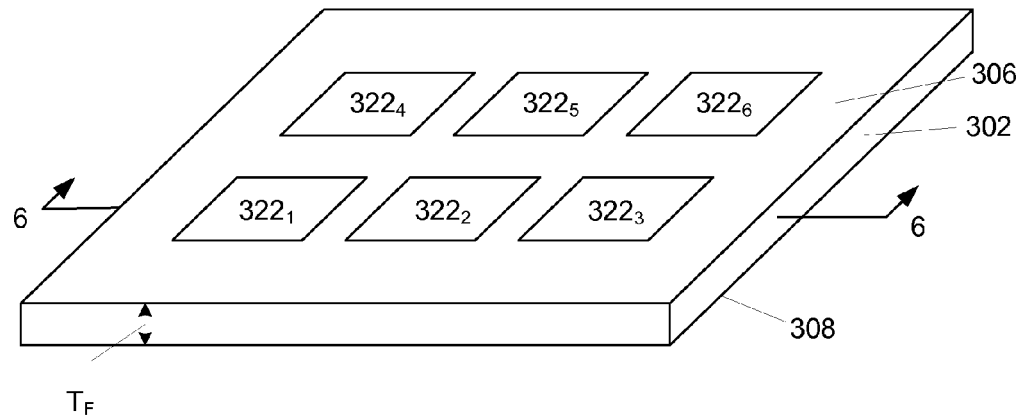
FIG. 5 is an oblique view of thermally conductive structures secured in a heat spreader frame, according to an embodiment of the present description.
Figure 6:
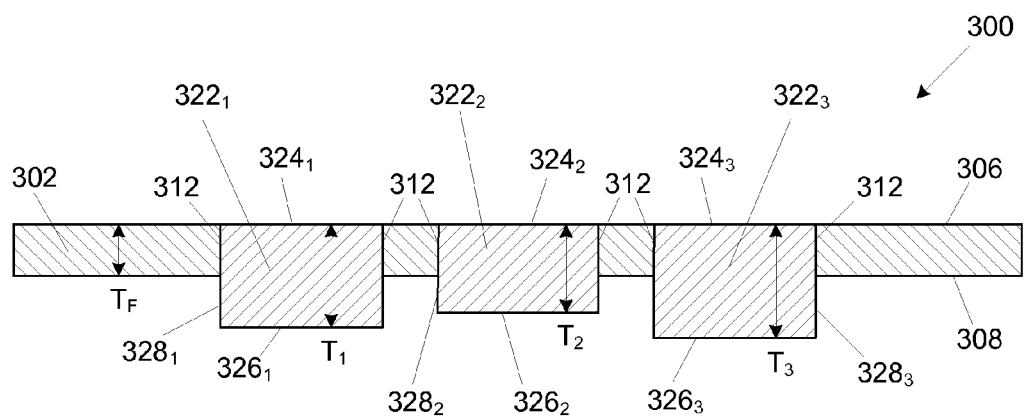
FIG. 6 is a side cross-sectional view of FIG. 5 along line 6-6, according to an embodiment of the present description.

As shown in FIGS. 5 and 6, each thermally conductive structure $322_n$ may be inserted and secured within a corresponding heat spreader frame opening 304. As previously discussed with regard to FIG. 2, each of the plurality of thermally conductive structures $322_1$, $322_2$, and $322_3$ may be secured within a corresponding plurality of openings 304 with the at least one thermally conductive structure sidewall $328_1$, $328_2$, and $328_3$ abutting its corresponding heat spreader frame sidewall 304. As further illustrated in FIGS. 5 and 6, each thermally conductive structure first surface $324_1$, $324_2$, and $324_3$ of each of the plurality of thermally conductive structures $322_1$, $322_2$, and $322_3$ may be substantially planar to the heat spreader frame first surface 306. The heat spreader frame openings 302 and the thermally conductive structures $322_n$ may be sized such that the thermally conductive structures $322_n$ can be press-fit, beaten, or swaged into the heat spreader frame openings 304, which secures each thermally conductive structure $322_n$ by pressure between its at least one thermally conductive structure sidewall (e.g. elements $328_1$, $328_2$, and $328_3$) and its corresponding at least one heat spreader frame sidewall 304 without requiring welding or adhesives.

The selection of the material used for the thermally conductive structures $322_n$ and the heat spreader frame 302 may depend on material cost and the thermal performance required, as will be understood to those skilled in the art. However, the heat spreader frame may formed from a material that is less expensive and less thermally conductive than the thermally conductive structures $322_n$, and may be any appropriate material, including, but not limited to, copper, aluminum, stainless steel, plastic materials, and the like. The thermally conductive structures $322_n$ may be any appropriate thermally conductive material including metals (in general, copper, aluminum, alloys thereof, and the like) and carbon materials. The thermally conductive structures $322_n$ may be any appropriate shape; however, in one embodiment of the present invention, the thermally conductive structures $322_n$ may be substantially cuboid for purposes of low cost from manufacturing, as will be understood to those skilled in the art.

Figure 7:
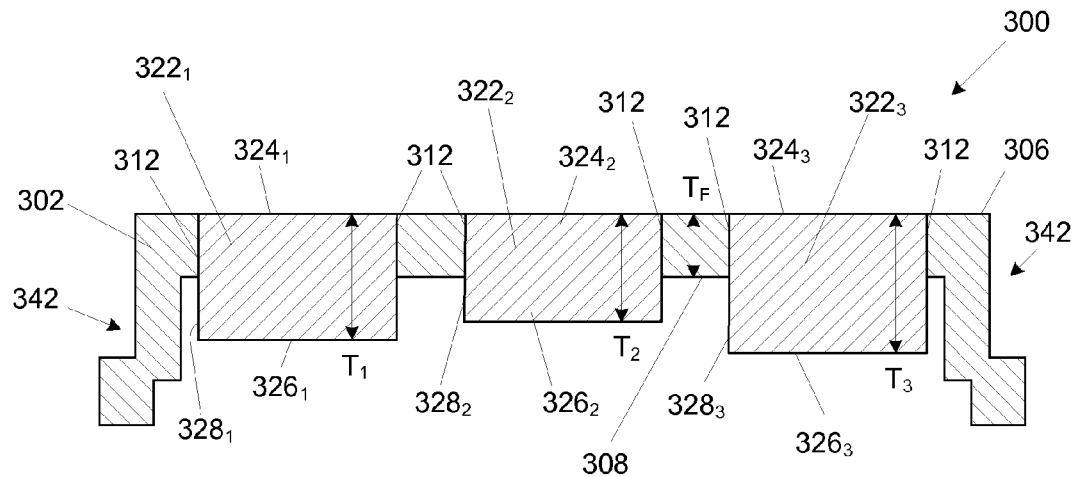
FIG. 7 is a side cross-sectional view of an integrated heat spreader, according to an embodiment of the present description.

A footing 342 may be formed from the heat spreader frame 302 to form the integrated heat spreader 300, as shown in FIG. 7. The footing 342 may be made by stamping the heat spreader frame 302. It is understood that the footing 342 may be formed before the attachment of the thermally conductive structures $322_n$. It is further understood that the heat spreader frame 302 with the footing 342 may be formed with a molding process or other such appropriate process.

The integrated heat spreader 300 of FIG. 7 may be attached to the microelectronic substrate 150 in the manner shown and discussed with regard to FIG. 2, such that the second surface $326_1$, $326_2$, and $326_3$ of each of the plurality of thermally conductive structures $322_1$, $322_2$, and $322_3$, respectively, may be in thermal contact with the back surface 116 of each corresponding microelectronic device $110_1$, $110_2$, and $110_3$, respectively, of the multi-chip package 100, and such at the footing 342 may be attached to the microelectronic substrate 150 with the adhesive material 252. It is understood that the dimensions of each thermally conductive structures $322_n$ may be sized to fit any dimension of the microelectronic devices, e.g. elements $110_1$, $110_2$, and $110_3$.

Figure 8:
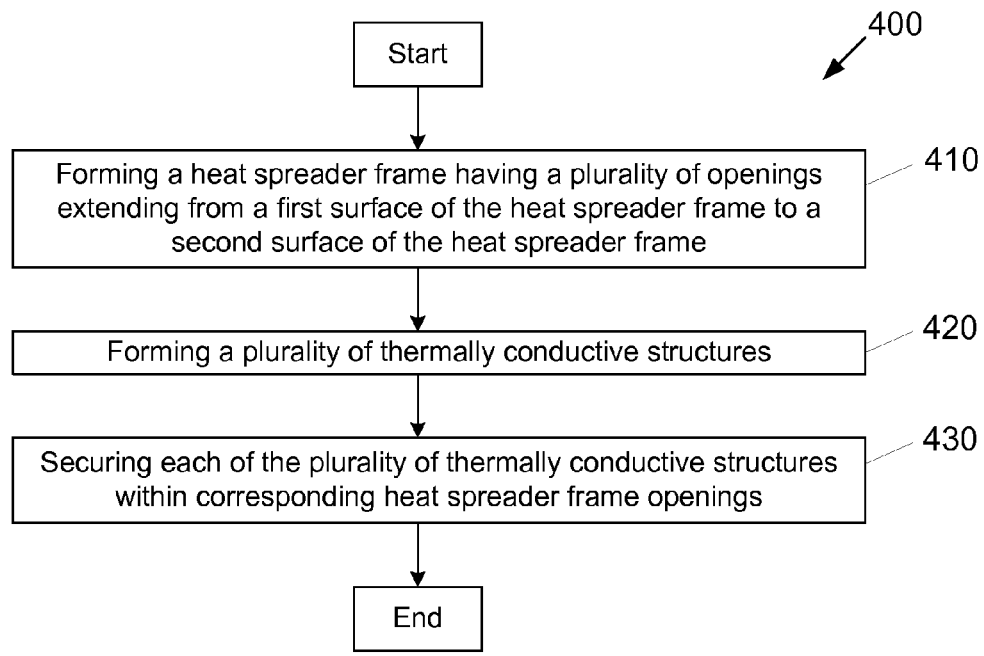
FIG. 8 is a flow chart of a process of fabricating an integrated heat spreader, according to an embodiment of the present description.

FIG. 8 is a flow chart of a process 400 of fabricating a microelectronic structure according to an embodiment of the present description, such as illustrated in FIGS. 3-7. As set forth in block 410, a heat spreader frame may be formed having a plurality of openings extending from a first surface of the heat spreader frame to a second surface of the heat spreader frame. A plurality of thermally conductive structures may be formed, as set forth in block 420. As set forth in block 430, each of the plurality of thermally conductive structures may be secured within corresponding heat spreader frame openings.

Figure 9:
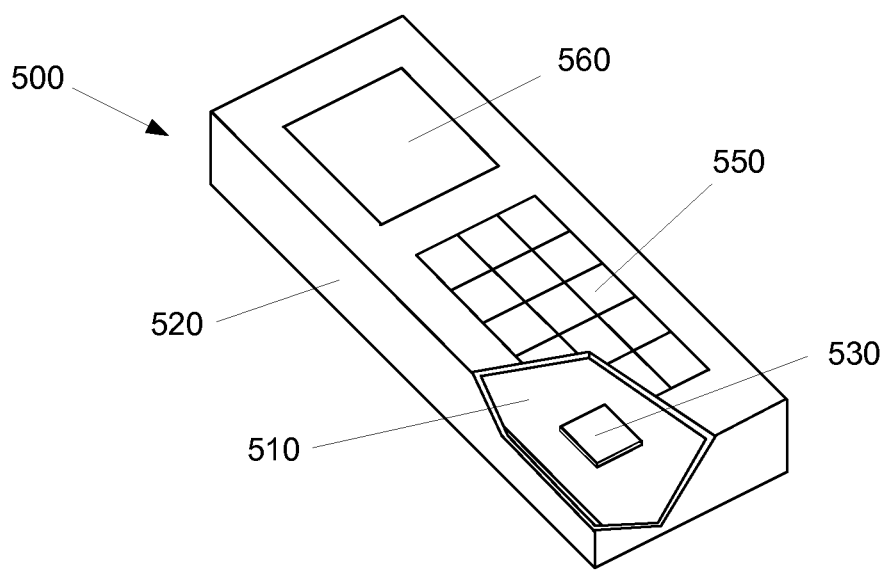
FIG. 9 is an electronic device/system, according to an embodiment of the present description.

FIG. 9 illustrates an embodiment of an electronic system/device 500, such as a portable computer, a desktop computer, a mobile telephone, a digital camera, a digital music player, a web tablet/pad device, a personal digital assistant, a pager, an instant messaging device, or other devices. The electronic system/device 500 may be adapted to transmit and/or receive information wirelessly, such as through a wireless local area network (WLAN) system, a wireless personal area network (WPAN) system, and/or a cellular network. The electronic system/device 500 may include a microelectronic motherboard or substrate 510 disposed within a device housing 520. The microelectronic motherboard/substrate 510 may have various electronic components electrically coupled thereto including an integrated heat spreader 530, as described in the embodiments of the present description, attached to the microelectronic motherboard/substrate 510, wherein a multi-chip package (not shown) is disposed between the integrated heat spreader 530 and the microelectronic motherboard/substrate 510. The microelectronic motherboard/substrate 510 may be attached to various peripheral devices including an input device 550, such as keypad, and a display device 560, such an LCD display. It is understood that the display device 560 may also function as the input device, if the display device 560 is touch sensitive.

It is understood that the subject matter of the present description is not necessarily limited to specific applications illustrated in FIGS. 1-9. The subject matter may be applied to other microelectronic device and assembly applications, as well as any appropriate heat removal application, as will be understood to those skilled in the art.

The following examples pertain to further embodiments, wherein Example 1 is an integrated heat spreader, comprising a heat spreader frame having a plurality of openings extending from a first surface of the heat spreader frame to a second surface of the heat spreader frame, wherein the plurality of openings each define at least one opening sidewall extending between the heat spreader frame first surface and the heat spreader frame second surface; a plurality of thermally conductive structures, each having a first surface, an opposing second surface, a least one sidewall extending between the thermally conductive structure first surface and the thermally conductive structure second surface, wherein each of the plurality of thermally conductive structures are secured within a corresponding plurality of openings with the at least one thermally conductive structure sidewall abutting its corresponding at least one heat spreader frame sidewall.

In Example 2, the subject matter of Example 1 can optionally include each of the plurality of thermally conductive structures being secured within a corresponding plurality of openings by pressure between the at least one thermally conductive structure sidewall and its corresponding at least one heat spreader frame sidewall.

In Example 3, the subject matter of any one of Examples 1-2 can optionally include the thermally conductive structure first surface of each of the plurality of thermally conductive structures being substantially planar to the heat spreader frame first surface.

In Example 4, the subject matter of any one of Examples 1-3 can optionally include the heat spreader frame having a thickness defined between the heat spreader frame first surface and the heat spreader frame second surface; wherein each thermally conductive structure having a thickness defined between its thermally conductive structure first surface and the thermally conductive structure second surface; and wherein the thickness of at least one of the plurality of thermally conductive structures is greater than the thickness of the heat spreader frame.

In Example 5, the subject matter of any one of Examples 1-4 can optionally include each thermally conductive structure having a thickness defined between its thermally conductive structure first surface and the thermally conductive structure second surface; and wherein the thickness of at least one of the plurality of thermally conductive structures is greater than the thickness of another one of the plurality of thermally conductive structures.

In Example 6, a microelectronic structure includes a microelectronic substrate; a multi-chip package electrically connected to the microelectronic substrate, wherein the multi-chip packing includes a plurality of microelectronic devices disposed thereon; and an integrated heat spreader attached to the microelectronic substrate, comprising: a heat spreader frame having a plurality of openings extending from a first surface of the heat spreader frame to a second surface of the heat spreader frame, wherein the plurality of openings each define at least one opening sidewall extending between the heat spreader frame first surface and the heat spreader frame second surface; and a plurality of thermally conductive structures, each having a first surface, an opposing second surface, a least one sidewall extending between the thermally conductive structure first surface and the thermally conductive structure second surface, wherein each of the plurality of thermally conductive structures are secured within a corresponding plurality of openings with the at least one thermally conductive structure sidewall abutting its corresponding at least one heat spreader frame sidewall, and wherein the second surface of each of the plurality of thermally conductive structures is in thermal contact with a corresponding microelectronic device of the multi-chip package.

In Example 7, the subject matter of Example 6 can optionally include each of the plurality of thermally conductive structures being secured within a corresponding plurality of openings by pressure between the at least one thermally conductive structure sidewall and its corresponding at least one heat spreader frame sidewall.

In Example 8, the subject matter of any one of Examples 6-7 can optionally include the thermally conductive structure first surface of each of the plurality of thermally conductive structures being substantially planar to the heat spreader frame first surface.

In Example 9, the subject matter of any one of Examples 6-8 can optionally include the heat spreader frame having a thickness defined between the heat spreader frame first surface and the heat spreader frame second surface; wherein each thermally conductive structure has a thickness defined between its thermally conductive structure first surface and the thermally conductive structure second surface; and wherein the thickness of at least one of the plurality of thermally conductive structures is greater than the thickness of the heat spreader frame.

In Example 10, the subject matter of any one of Examples 6-9 can optionally include each thermally conductive structure having a thickness defined between its thermally conductive structure first surface and the thermally conductive structure second surface; and wherein the thickness of at least one of the plurality of thermally conductive structures is greater than the thickness of another one of the plurality of thermally conductive structures.

In Example 11, the subject matter of any one of Examples 6-10 can optionally include the heat spreader frame being attached to the microelectronic substrate.

In Example 12, the subject matter of Example 11, can optionally include at least one footing extending from the heat spreader frame, wherein the at least one heat spreader frame footing is attached to the microelectronic substrate.

In Example 13, an electronic system comprises a housing; a microelectronic substrate disposed within the housing; a microelectronic substrate; a multi-chip package electrically connected to the microelectronic substrate, wherein the multi-chip packing includes a plurality of microelectronic devices disposed thereon; and an integrated heat spreader attached to the microelectronic substrate, comprising: a heat spreader frame having a plurality of openings extending from a first surface of the heat spreader frame to a second surface of the heat spreader frame, wherein the plurality of openings each define at least one opening sidewall extending between the heat spreader frame first surface and the heat spreader frame second surface; and a plurality of thermally conductive structures, each having a first surface, an opposing second surface, a least one sidewall extending between the thermally conductive structure first surface and the thermally conductive structure second surface, wherein each of the plurality of thermally conductive structures are secured within a corresponding plurality of openings with the at least one thermally conductive structure sidewall abutting its corresponding at least one heat spreader frame sidewall, and wherein the second surface of each of the plurality of thermally conductive structures is in thermal contact with a corresponding microelectronic device of the multi-chip package.

In Example 14, the subject matter of Example 13 can optionally include each of the plurality of thermally conductive structures are secured within a corresponding plurality of openings by pressure between the at least one thermally conductive structure sidewall and its corresponding at least one heat spreader frame sidewall.

In Example 15, the subject matter of any one of Examples 13-14 can optionally include the thermally conductive structure first surface of each of the plurality of thermally conductive structures being substantially planar to the heat spreader frame first surface.

In Example 16, the subject matter of any one of Examples 13-15 can optionally include the heat spreader frame having a thickness defined between the heat spreader frame first surface and the heat spreader frame second surface; wherein each thermally conductive structure have a thickness defined between its thermally conductive structure first surface and the thermally conductive structure second surface; and wherein the thickness of at least one of the plurality of thermally conductive structures is greater than the thickness of the heat spreader frame.

In Example 17, the subject matter of any one of Examples 13-16 can optionally include each thermally conductive structure having a thickness defined between its thermally conductive structure first surface and the thermally conductive structure second surface; and wherein the thickness of at least one of the plurality of thermally conductive structures is greater than the thickness of another one of the plurality of thermally conductive structures.

In Example 18, the subject matter of any one of Examples 13-17 can optionally include the heat spreader frame attached to the microelectronic substrate.

In Example 19, the subject matter of Example 18 can optionally include at least one footing extending from the heat spreader frame and wherein the at least one heat spreader frame footing is attached to the microelectronic substrate.

In Example 20, a microelectronic structure is fabricated by forming a heat spreader frame having a plurality of openings extending from a first surface of the heat spreader frame to a second surface of the heat spreader frame; forming a plurality of thermally conductive structures; and securing each of the plurality of thermally conductive structures within corresponding heat spreader frame openings.

In Example 21, the subject matter of Example 20 can optionally include securing each of the plurality of thermally conductive structures within the corresponding plurality of openings by pressure between the at least one thermally conductive structure sidewall and its corresponding at least one heat spreader frame sidewall.

In Example 22, the subject matter of any one of Examples 20-21 can optionally include securing each of the plurality of thermally conductive structure such that the thermally conductive structure first surface of each of the plurality of thermally conductive structures are substantially planar to the heat spreader frame first surface.

In Example 23, the subject matter of any one of Examples 20-22 can optionally include forming the heat spreader frame to have a thickness defined between the heat spreader frame first surface and the heat spreader frame second surface; wherein forming the plurality of thermally conductive structures comprises forming each thermally conductive structure to have a thickness defined between its thermally conductive structure first surface and the thermally conductive structure second surface; and wherein the thickness of at least one of the plurality of thermally conductive structures is greater than the thickness of the heat spreader frame.

In Example 24, the subject matter of any one of Examples 20-23 can optionally include forming the plurality of thermally conductive structures comprising forming each thermally conductive structure to have a thickness defined between its thermally conductive structure first surface and the thermally conductive structure second surface; and wherein the thickness of at least one of the plurality of thermally conductive structures is greater than the thickness of another one of the plurality of thermally conductive structures.

In Example 25, the subject matter of any one of Examples 20-24 can optionally include forming a microelectronic substrate; electrically connecting a multi-chip package to the microelectronic substrate, wherein the multi-chip packing includes a plurality of microelectronic devices disposed thereon; and thermally contacting the second surface of each of the plurality of thermally conductive structures with a corresponding microelectronic device of the multi-chip package.

In Example 26, the subject matter of Example 25 can optionally include attaching the heat spreader frame to the microelectronic substrate.

In Example 27, the subject matter of Example 26 can optionally include attaching at least one footing extending from the heat spreader to the microelectronic substrate.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:
1. An integrated heat spreader, comprising:
a heat spreader frame having a plurality of openings extending from a first surface of the heat spreader frame to a second surface of the heat spreader frame, wherein the plurality of openings each define at least one opening sidewall extending between the heat spreader frame first surface and the heat spreader frame second surface;

a plurality of thermally conductive structures, each having a first surface, an opposing second surface, a least one sidewall extending between the thermally conductive structure first surface and the thermally conductive structure second surface, wherein each of the plurality of thermally conductive structures are secured within a corresponding plurality of openings with the at least one thermally conductive structure sidewall abutting its corresponding at least one heat spreader frame sidewall, and wherein the first surface of each of the plurality of thermally conductive structures are substantially planar to the heat spreader frame first surface; and wherein the heat spreader frame has a thickness defined between the heat spreader frame first surface and the heat spreader frame second surface; wherein each thermally conductive structure has a thickness defined between its thermally conductive structure first surface and the thermally conductive structure second surface; and wherein the thickness of at least one of the plurality of thermally conductive structures is greater than the thickness of the heat spreader frame.

2. The integrated heat spreader of claim 1, wherein each of the plurality of thermally conductive structures are secured within a corresponding plurality of openings by pressure between the at least one thermally conductive structure sidewall and its corresponding at least one heat spreader frame sidewall.

3. The integrated heat spreader of claim 1, wherein each thermally conductive structure has a thickness defined between its thermally conductive structure first surface and the thermally conductive structure second surface; and wherein the thickness of at least one of the plurality of thermally conductive structures is greater than the thickness of another one of the plurality of thermally conductive structures.

4. The integrated heat spreader of claim 1, wherein a material used for at least one of the plurality of thermally conductive structures differs from a material used for the heat spreader frame.

5. The integrated heat spreader of claim 1, wherein the heat spreader frame comprises a material selected from the groups consisting of copper, aluminum, stainless steel, and plastic.

6. The integrated heat spreader of claim 1, wherein at least one of the plurality of thermally conductive structures comprise a material selected from the groups consisting of copper, aluminum, and carbon materials.

7. The integrated heat spreader of claim 1, wherein at least one of the plurality of thermally conductive structures are substantially cuboid.

\* \* \* \* \*